(12) United States Patent
Jiang et al.

(10) Patent No.: US 10,734,444 B1
(45) Date of Patent: Aug. 4, 2020

(54) INTEGRATED CIRCUITS WITH INTEGRATED MEMORY STRUCTURES AND CAPACITORS AND METHODS FOR FABRICATING THE SAME

(71) Applicant: Globalfoundries Singapore Pte. Ltd., Singapore (SG)

(72) Inventors: Yi Jiang, Singapore (SG); Curtis Chun-I Hsieh, Singapore (SG); Wanbing Yi, Singapore (SG); Juan Boon Tan, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 0 days.

(21) Appl. No.: 16/259,549

(22) Filed: Jan. 28, 2019

(51) Int. Cl.
| H01L 27/22 | (2006.01) |
| H01L 49/02 | (2006.01) |
| H01L 43/02 | (2006.01) |
| H01L 43/08 | (2006.01) |
| H01L 43/12 | (2006.01) |

(52) U.S. Cl.
CPC .......... *H01L 27/224* (2013.01); *H01L 28/60* (2013.01); *H01L 43/02* (2013.01); *H01L 43/08* (2013.01); *H01L 43/12* (2013.01)

(58) Field of Classification Search
CPC ......... H01L 28/60; H01L 43/02; H01L 43/08; H01L 43/12
See application file for complete search history.

(56) References Cited

U.S. PATENT DOCUMENTS

| 6,117,747 A | 9/2000 | Shao et al. |
| 2006/0177979 A1* | 8/2006 | Tu ............... H01L 21/28079 438/243 |
| 2014/0049872 A1 | 2/2014 | Huang et al. |
| 2014/0063895 A1* | 3/2014 | Li ..................... H01L 27/22 365/97 |

\* cited by examiner

*Primary Examiner* — Dale E Page
*Assistant Examiner* — Quovaunda Jefferson
(74) *Attorney, Agent, or Firm* — Yee Tze Lim; Hoffman Warnick LLC

(57) ABSTRACT

Integrated circuits with integrated memory devices and high capacitors, and methods for fabricating such integrated circuits are provided. An exemplary method for fabricating an integrated circuit includes forming, from a lower conductive layer, a lower memory interconnect and a lower capacitor interconnects over a substrate. The method further includes forming a conductive memory via coupled to the lower memory interconnect and a conductive capacitor vias coupled to the lower capacitor interconnect. Also, the method includes forming a memory structure over the memory via and forming a capacitor dielectric layer over the memory structure and over the capacitor via. Further, the method includes forming, from an upper conductive layer, an upper memory interconnect coupled to the memory structure and an upper capacitor interconnects over the capacitor dielectric layer over the capacitor via. The capacitor via, capacitor dielectric layer, and upper capacitor interconnects form the high capacitor.

19 Claims, 4 Drawing Sheets

INTEGRATED CIRCUITS WITH INTEGRATED MEMORY STRUCTURES AND CAPACITORS AND METHODS FOR FABRICATING THE SAME

TECHNICAL FIELD

The technical field generally relates to sophisticated semiconductor devices and the manufacturing of such devices, and, more specifically, to integrated circuits with integrated memory structures and capacitors.

BACKGROUND

Passive components such as capacitors are used extensively in integrated circuit design, such as for radio-frequency (RF) and mixed-signal applications, including bypassing, interstage coupling, and in resonant circuits and filters. With a desire for higher-levels of integration to achieve reduction in cost associated with integrated circuit fabrication processes, there is an effort to economize each step of the integrated circuit fabrication process to the greatest extent possible, while maintaining the highest degree of quality and functionality as possible.

Metal on metal (MOM) and poly on poly (POP) capacitors attain very precise capacitance values in analog circuits. A benefit of MOM and POP capacitors is that they are able to achieve a high capacitance value for a small area. MOM capacitors are commonly formed on a silicon substrate by depositing a first metal layer of titanium (Ti), followed by the deposition of a titanium nitride (TiN) layer, which serves as one of the capacitor's electrodes. A capacitor dielectric material is then deposited over the TiN. Following the deposition of the capacitor dielectric layer, a metal, which serves as the other capacitor's electrode, is deposited over the dielectric layer. The various layer are then patterned and etched to form the desired capacitor structure. Often these MOM and POP capacitors will be formed within an opening in a dielectric material.

A drawback of MOM and POP capacitors is the number of processing steps used to form such capacitors. Conventional processing for these structures requires additional mask-steps during the manufacturing process, which directly translates into added cost. With each processing step, the manufacturing cost of the integrated circuit increases, and due to the competitive market that exists in the integrated circuit fabrication industry, any additional cost is highly undesirable.

Accordingly, it is desirable to provide integrated circuits with improved capacitors that provide accurate capacitance values and high capacitance values per unit area, but that are capable of being manufactured using the least number of processing steps possible and thereby, saving manufacturing costs. Further, it is desirable to integrate such capacitors in integrated circuits with memory structures. It is also desirable to provide methods for fabricating integrated circuits with integrated memory structures and capacitors that are less expensive and less time consuming than current methods. Furthermore, other desirable features and characteristics will become apparent from the subsequent detailed description and the appended claims, taken in conjunction with the accompanying drawings and this background.

BRIEF SUMMARY

Integrated circuits with integrated memory devices and capacitors, and methods for fabricating such integrated circuits are provided. An exemplary method for fabricating an integrated circuit includes forming, from a lower conductive layer, a lower memory interconnect and a lower capacitor interconnects over a substrate. The method further includes forming a conductive memory via coupled to the lower memory interconnect and a conductive capacitor vias coupled to the lower capacitor interconnect. Also, the method includes forming a memory structure over the memory via and forming a capacitor dielectric layer over the memory structure and over the capacitor via. Further, the method includes forming, from an upper conductive layer, an upper memory interconnect coupled to the memory structure and an upper capacitor interconnects over the capacitor dielectric layer over the capacitor via. The capacitor via, capacitor dielectric layer, and upper capacitor interconnects form the capacitor.

In another embodiment, a method for fabricating an integrated circuit including a memory device and a capacitor is provided. The method includes providing a semiconductor substrate including a memory region and a logic region. The method includes forming a magnetic tunnel junction (MTJ) structure over the substrate in the memory region. The MTJ structure includes a lowest surface formed by a bottom electrode and an uppermost surface formed by a top electrode, and the MTJ structure has a height from the lowest surface to the uppermost surface. Further, the method includes forming a capacitor over the substrate in the memory region. The capacitor includes a lower capacitor electrode element and an upper capacitor electrode element, and the upper capacitor electrode element is separated from the lower capacitor electrode element by a distance equal to the height of the MTJ structure.

In another embodiment, an integrated circuit is provided and includes a semiconductor substrate including a memory region and a logic region. The integrated circuit further includes a magnetic tunnel junction (MTJ) structure over the substrate in the memory region. The MTJ structure includes a lowest surface formed by a bottom electrode at a first height over the substrate. Also, the integrated circuit includes a capacitor over the substrate in the memory region. The capacitor includes a lower capacitor electrode element having an uppermost surface at a second height over the substrate, and the second height is equal to the first height.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF THE DRAWINGS

The various embodiments will hereinafter be described in conjunction with the following drawing figures, wherein like numerals denote like elements, and wherein.

DETAILED DESCRIPTION

The following detailed description is merely exemplary in nature and is not intended to limit the integrated circuits with integrated memory devices and capacitors and methods for fabricating such integrated circuits. Furthermore, there is no intention to be bound by any expressed or implied theory presented in the preceding technical field, background or brief summary, or in the following detailed description.

For the sake of brevity, conventional techniques related to conventional device fabrication may not be described in detail herein. Moreover, the various tasks and processes described herein may be incorporated into a more comprehensive procedure or process having additional functionality not described in detail herein. In particular, various processes in the fabrication memory devices are well-known and so, in the interest of brevity, many conventional processes will only be mentioned briefly herein or will be omitted entirely without providing the well-known process details. Further, it is noted that integrated circuits with memory structure, include a varying number of components and that single components shown in the illustrations may be representative of multiple components.

As used herein, it will be understood that when an element or layer is referred to as being "over" or "under" another element or layer, it may be directly on the other element or layer, or intervening elements or layers may be present. When an element or layer is referred to as being "on" another element or layer, it is directly on and in contact with the other element or layer. Further, spatially relative terms, such as "upper", "uppermost", "over", "under", "lower", "lowest" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as being "under" other elements or features would then be oriented "above" the other elements or features. Thus, the exemplary term "under" can encompass either an orientation of above or below. The device may be otherwise oriented (rotated 90 degrees or at other orientations) and the spatially relative descriptors used herein may likewise be interpreted accordingly.

Further, as used herein, a layer identified as a "material layer" or as being a "material" includes at least 50 wt. % of the recited material. As used herein, a layer identified as a "primarily material layer" or as being "primarily material" is a layer that includes at least 90 wt. % of the recited material.

As will be readily apparent to those skilled in the art upon a complete reading of the disclosure, the devices disclosed herein may be employed with a variety of technologies, and may be incorporated into a variety of integrated circuit products. With reference to the attached drawings, various illustrative embodiments of the methods and devices disclosed herein will now be described in more detail. It should be understood that the various features and layers in the attached drawings may not be to scale.

Embodiments herein are directed towards integrated circuits including, in part, memory structures, for example magnetoresistive random access memory (MRAM) structures or resistive random access memory (RRAM) structures. Further, exemplary embodiments herein are directed towards integrated circuits including, in part, capacitors, for example interdigitated capacitors, such as those that use lateral (fringe) fields. Exemplary capacitors include metal on metal (MOM) capacitors or poly on poly (POP) capacitors.

In embodiments described herein, methods form a memory structure or structures in a memory region of an integrated circuit and a capacitor or capacitors in a logic region of the integrated circuit using the same processing. For example, lower interconnects in each region may be formed by depositing a lower metallization layer. Conductive vias may be formed in each region coupled to the respective lower interconnects. Each pair of coupled conductive via and lower interconnect in the logic region forms a lower electrode element of a capacitor, having an increased height "a" as compared to conventionally formed electrode elements. A bottom electrode, memory layers, and top electrode may be formed in the memory region over the conductive via, and dielectric material may be formed in the logic region over the conductive vias. Further, upper conductive interconnects may be formed in each region, with the upper conductive interconnect coupled to the top electrode in the memory region and each upper conductive interconnect forming an upper electrode element of the capacitor in the logic region.

Exemplary capacitors are formed with increased parallel capacitance as compared to conventional processing due to an increase in area of each lower electrode element that is formed by the coupled lower interconnect and conductive via. Further, the distance reduction between each lower electrode element and the respective overlying upper electrode element is reduced as compared to conventionally fabricated capacitors, thereby increasing resistance between the lower and upper electrode elements.

Figure 1:
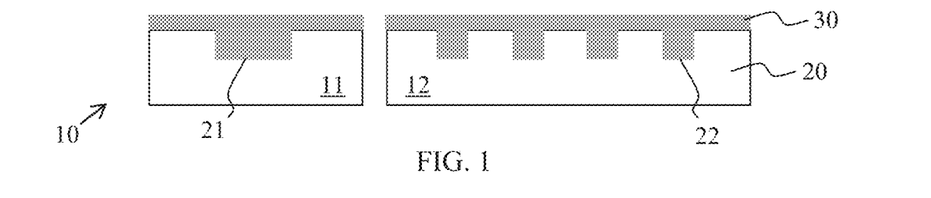
FIGS. 1-9 are cross sectional schematic views of integrated circuit fabrication processing for forming an integrated circuit with an integrated memory structure and capacitor in accordance with embodiments herein.

FIGS. 1-9 depict an embodiment of a method for fabricating an integrated circuit device 10 including an integrated memory structure and capacitor. In FIG. 1, a partially fabricated integrated circuit device 10 is illustrated and includes substrate 20. An exemplary substrate 20 is a semiconductor substrate. As used herein, the term "semiconductor substrate" encompasses semiconductor materials conventionally used in the semiconductor industry from which to make electrical devices. Semiconductor materials include monocrystalline silicon materials, such as the relatively pure or lightly impurity-doped monocrystalline silicon materials typically used in the semiconductor industry, as well as polycrystalline silicon materials, and silicon admixed with other elements such as germanium, carbon, and the like. In addition, "semiconductor material" encompasses other materials such as relatively pure and impurity-doped germanium, gallium arsenide, zinc oxide, glass, and the like. In an exemplary embodiment, the semiconductor material is a silicon substrate, such as crystalline silicon. The silicon substrate may be a bulk silicon wafer or may be a thin layer of silicon on an insulating layer (in a structure commonly known as semiconductor-on-insulator or SOI) that, in turn, is supported by a carrier wafer. The insulating layer, for example, may be formed of a dielectric insulating material. An exemplary insulating layer is from silicon oxide, which provides a buried oxide (BOX) layer. Other types of dielectric insulating materials may also be useful. The SOI substrate, for example, may be a fully depleted silicon-on-insulator (FDSOI) substrate. For example, the thin surface and bulk layers may be single crystalline silicon. Other types of SOI substrates may also be useful. It is understood that the surface and bulk layers need not be formed of the same material. While not illustrated, semiconductor devices, such as metal oxide field effect transistors (MOSFETs), capacitors, resistors, and the like may be formed in the semiconductor substrate according to conventional integrated circuit processing. The devices formed during a series of processes that form individual integrated circuit components, e.g., transistors, capacitors, resistors, etc., over substrate may be interconnected into a circuit by means of one or more metal interconnecting layers, i.e., metallization layers. In an exemplary embodiment, lower levels of capacitor electrode elements may be formed in the substrate 20.

As shown, the substrate 20 includes a memory region 11, where a memory structure or structures may be formed, and a logic region 12, where a capacitor or capacitors and other logic devices may be formed. It is noted that the Figures illustrate a break in the substrate 20 between the memory region 21 and the logic region 22; however, such regions may be direct adjacent one another or have intervening regions therebetween with no physical break in the substrate 20.

In FIG. 1, the method is shown to include etching the substrate 20 to form a trench 21 in the memory region 11 and trenches 22 in the logic region 12. Further, the method includes depositing a conductive material 30 over the substrate 20, including in the trenches 21 and 22. The conductive material 30 may be copper or another suitable metal. In an exemplary embodiment, the conductive material 30 may be part of a metallization layer deposited over the substrate 20.

Figure 2:
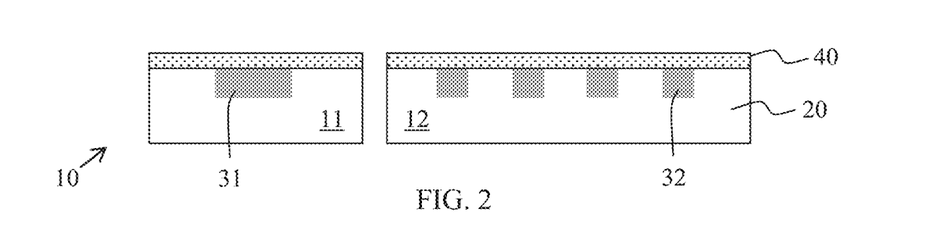

In FIG. 2, the method continues with the removal of conductive material 30 from outside of the trenches 21 and 22 to form a lower conductive interconnect 31 in the memory region 11 and lower conductive interconnects 32 in the logic region 12. The lower conductive interconnects 11 and 12 may be coupled to underlying semiconductor devices or elements or additional circuitry or metallization layers that are not illustrated.

As further shown in FIG. 2, a capping layer 40 is formed over the substrate 20, including over the lower conductive interconnects 31 and 32. The capping layer 40 may be a passivation layer and/or a barrier layer. For example, the capping layer 40 may block or prevent contact between the conductive interconnects 31 and 32 and later deposited dielectric material. The capping layer may be formed by using chemical vapor deposition (CVD) or plasma enhanced CVD (PE-CVD) processes.

In one example, silicon carbide with nitrogen deposited using chemical vapor deposition (CVD) from a trimethylsilane source, which is commercially available from Applied Materials under the tradename of BLOK®, is used as the capping layer 40. The compound with less nitrogen (N) (less than about 5 mol %), i.e., SiaCbNcHd, is referred to as "BLoK", and the compound with more N (about 10 mol % to about 25 mol %), i.e., SiwCxNyHz, is referred to as "NBLoK". BLoK has a lower dielectric constant of less than 4.0, whereas NBLoK has a dielectric constant of about 5.0. While BLoK is not a good oxygen barrier but is a good copper (Cu) barrier, NBLoK is both a good oxygen barrier and a good copper barrier. In an exemplary embodiment, the capping layer 40 is or includes NBLoK material.

Figure 3:
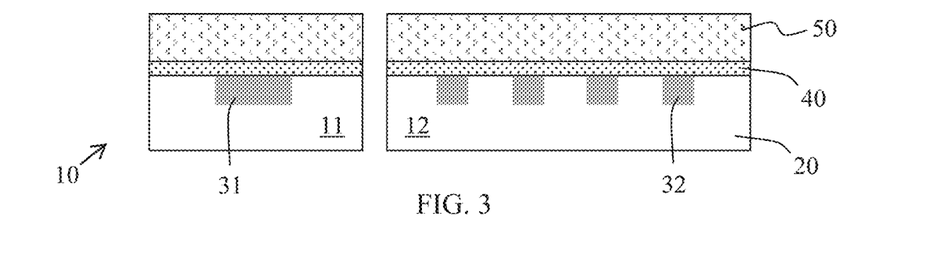

In FIG. 3, the method includes forming an insulator layer 50 over the substrate 20 in both the memory region 11 and the logic region 12. In one example, the insulator layer 50 is formed from silicon oxide. Specifically, the insulator layer 50 may be formed from tetraethyl orthosilicate (TEOS).

Figure 4:
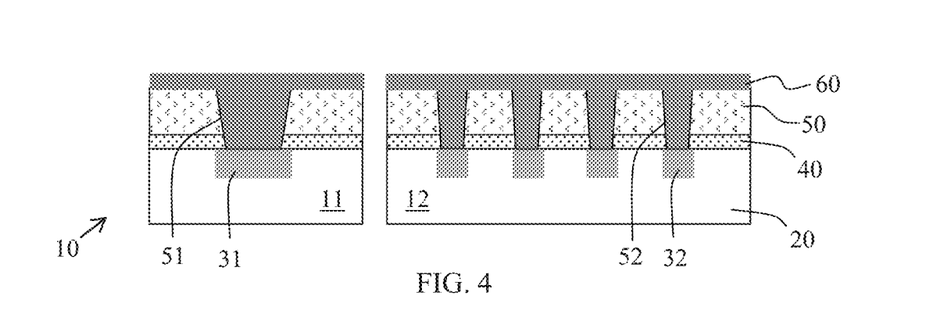

The method may continue as illustrated in FIG. 4, with the etching of the insulator layer 50 and of the capping layer 40 directly over the lower interconnects 31 and 32. As shown, the etching process forms a via opening 51 in the memory region 11 that extends completely through the insulator layer 50 and the capping layer 40 to expose a surface portion of the lower interconnect 31. Further, the etching process forms via openings 52 in the logic region 12 that extend completely through the insulator layer 50 and the capping layer 40 to expose a surface portion of each lower interconnect 32. The etching process for forming the via openings 51 and 52 may include conventional deposition and lithography processing including masking and etching.

FIG. 4 further illustrates the deposition of a conductive material 60 over the insulator layer 50 and in the via openings 51 and 52. As shown, the conductive material 60 may fill the via openings 51 and 52. In an exemplary embodiment, the conductive material 60 is tantalum nitride (TaN) or tungsten (W), and/or other commonly used conductive metals. An exemplary embodiment deposits the conductive material 60 by a chemical vapor deposition (CVD) process.

Figure 5:
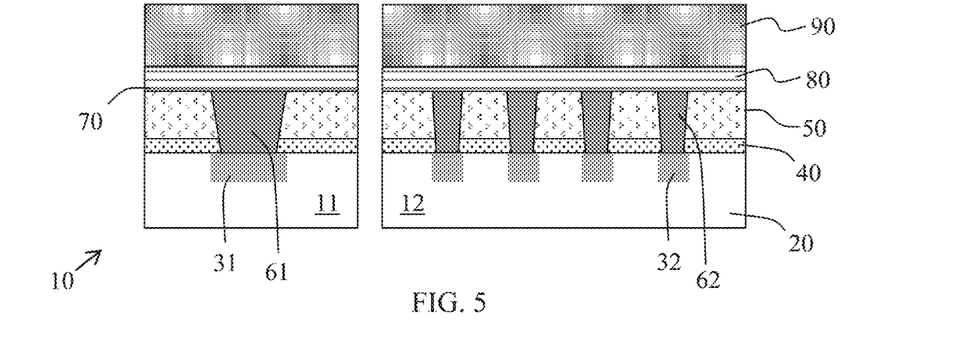

In FIG. 5, the method includes removing the portion of the conductive material 60 outside of the via openings 51 and 52. For example, the method may include a chemical mechanical planarization (CMP) process for removing the conductive material 60 outside of the via openings 51 and 52. As a result, a conductive via 61 is formed over and electrically coupled to the lower interconnect 31 in the memory region 11 and conductive vias 62 are formed over and electrically coupled to the lower interconnects 32 in the logic region 12.

FIG. 5 further illustrates the integrated circuit device 10 after performing several deposition processes. Specifically, memory structure layers are successively blanket deposited over regions 11 and 12, specifically over the insulator layer 50, over conductive via 61, and over conductive vias 62. As shown, the memory structure layers include a bottom electrode layer 70, magnetic tunnel junction (MTJ) layers 80, and a top electrode layer 90.

Though not necessary, in certain embodiments the bottom electrode layer 70 and top electrode layer 90 are formed from a same metal material. An exemplary bottom electrode layer 70 is a conductive material, such as a metal, including metal alloys. In an exemplary embodiment, bottom electrode layer 70 is tantalum, tantalum nitride, titanium, tungsten, and/or other commonly used conductive metals. In an exemplary embodiment, the bottom electrode layer 70 is formed by depositing the conductive material by a PVD process. An exemplary top electrode layer 90 is a conductive material, such as a metal or a metal alloy. In an exemplary embodiment, top electrode layer 90 is tantalum, tantalum nitride, titanium, tungsten, and/or other commonly used conductive metals. In an exemplary embodiment, the top electrode layer 90 is formed by depositing the conductive material by a PVD process.

While MTJ layers are collectively identified by reference number 80, any number of desired and suitable MTJ layers may be utilized. Exemplary MTJ layers 80 may include a magnetically fixed layer or polarizer layer, a tunnel barrier layer or layers, a magnetically free layer or storage layer, seed layers, wetting layers, spacer layers, anti-ferromagnetic layers, and the like. It is realized that MTJ layers of many variations may be provided that are within the scope of the present disclosure. The MTJ layers 80 may be deposited using physical vapor deposition (PVD) or ALD techniques.

Figure 6:
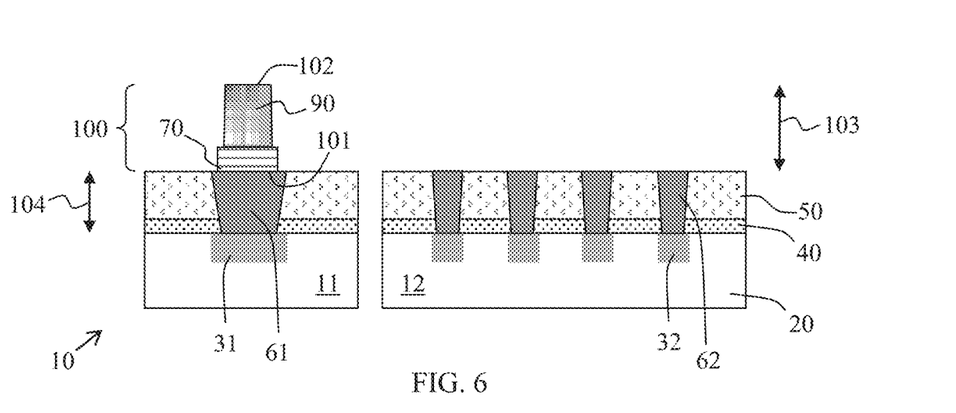

In FIG. 6, the method may continue with etching the top electrode layer 90, MTJ layers 80, and bottom electrode layer 70 to form a memory structure 100, such as a stack of MTJ layers, over the conductive via 61 in memory region 11. As shown, the top electrode layer 90, MTJ layers 80, and bottom electrode layer 70 are removed from the rest of the memory region 11 and from all of the logic region 12. While not illustrated, the etching process may remove an upper portion of the insulator layer 50 such that the conductive vias 61 and 62 have an upper surface that is higher than the lowered surface of the insulator layer 50.

In FIG. 6, it may be seen that the memory structure 100 has a lowest surface 101 formed by the bottom electrode layer 70 at the interface with the conductive via 61. Further, the memory structure 100 has an uppermost surface 102 formed by the top electrode layer 90. The distance between the lowest surface 101 and the uppermost surface 102 is the maximum height 103 of the memory structure 100. As further shown, the lowest surface 101 is located at a height 104 over the surface of the substrate 20 or lower interconnect 31.

Figure 7:
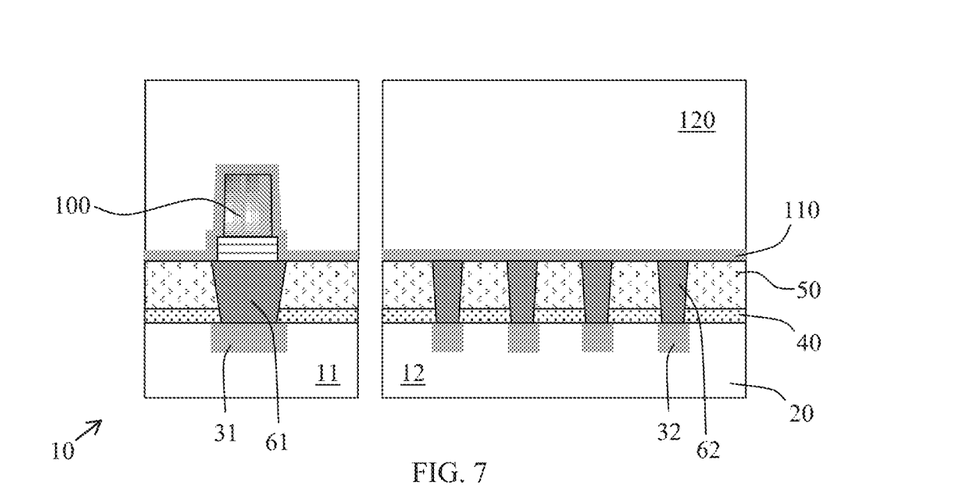

The method may continue in FIG. 7 with several deposition processes, including the deposition of an encapsulation layer 110 and an interlayer dielectric 120. As shown, the encapsulation layer 110 may be blanket deposited over the first and second regions 11 and 12, and over the memory structure 100, including on the sidewalls the memory structure 100. The encapsulation layer 110 may be a non-oxidizing material, such as a dielectric material. The encapsulation layer 110 may prevent oxidation of the layers of the memory structure 100. In an exemplary embodiment, the encapsulation layer 110 is silicon nitride, though other suitable materials may be used. In an exemplary embodiment, encapsulation layer 110 is deposited by an ALD process.

Figure 8:
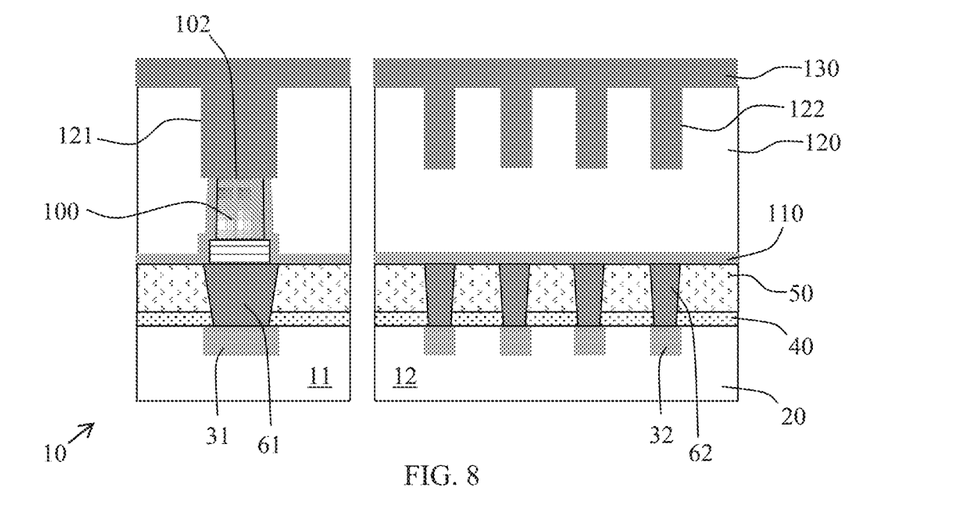

As further shown, the interlayer dielectric 120 is deposited over the encapsulation layer 110. The interlayer dielectric 120 may include several distinct layers. In an exemplary embodiment, the interlayer dielectric 120 is silicon oxide, such as carbon-doped silicone oxide (SiCOH). In an exemplary embodiment, the interlayer dielectric 120 is deposited by a flowable CVD process. The method may further include annealing the interlayer dielectric 120 and planarizing the interlayer dielectric 120. The encapsulation layer 110 and interlayer dielectric 120 may be collectively referred to as a capacitor dielectric layer FIG. 8 illustrates the integrated circuit 10 after several further processes. As shown, the interlayer dielectric 120 is etched to form an opening 121 in the memory region 11 and trenches 122 in the logic area 12. As shown, the opening 121 extends through the interlayer dielectric 120 and through the encapsulation layer 110 and exposes a portion of the uppermost surface 102 of the memory structure 100. The trenches 122 do not extend through the interlayer dielectric 120. Rather, the trenches 122 extend to a depth at a desired height above the lower interconnects 62 so that a portion of the interlayer dielectric 120 remains underlying the trenches 122. In an exemplary embodiment, the depth of the opening 121 is equal to the depth of each trench 122. The process for forming the opening 121 and trenches 122 may include conventional deposition and lithography processing including masking and etching.

As shown, the method includes deposition of a conductive material 130 over regions 11 and 12, including in the opening 121 and trenches 122. The conductive material 130 may be a metal such as copper or another suitable metal. As shown, the conductive material 130 may fill the opening 121 and trenches 122. Further, the conductive material 130 is formed in contact with the uppermost surface 102 of the memory structure 100. Deposition of the conductive material 130 may be performed as a metallization process, i.e., the conductive material 130 may be a metallization layer deposited over the substrate 20.

Figure 9:
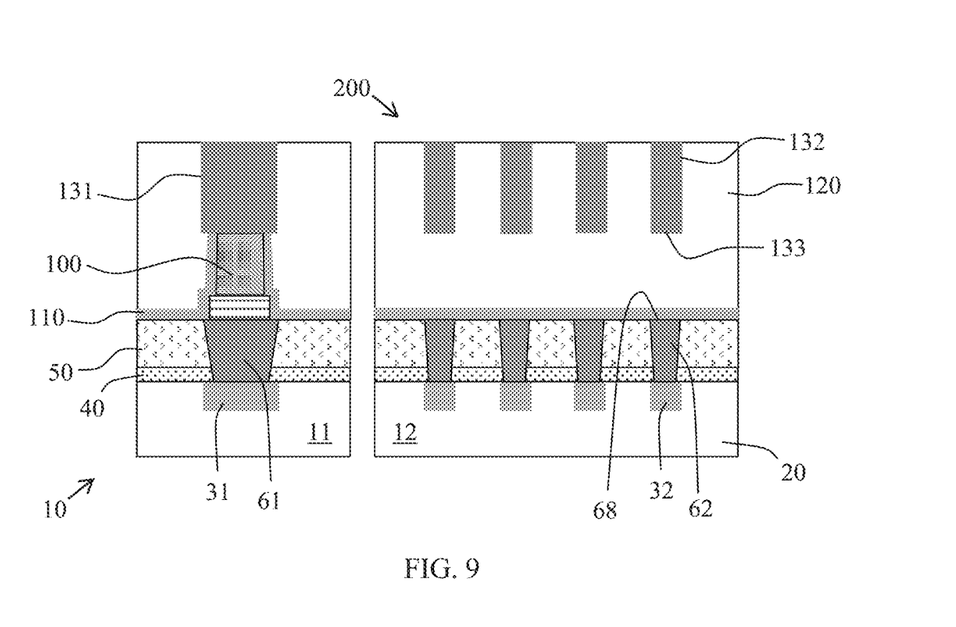

In FIG. 9, the method continues with removal of the conductive material 130 from outside the opening 121 and the trenches 122. For example, a planarization process such as CMP may be performed to remove the conductive material 130 from outside the opening 121 and the trenches 122.

As a result, an upper conductive interconnect 131 is formed over and coupled to the memory structure 100 and upper conductive interconnects 132 are formed over, but not electrically coupled to, the conductive vias 62 in the logic region 12. Specifically, each upper interconnect 132 has a lowest surface 133 that is distanced from the uppermost surface 63 of a respective conductive via 62 by dielectric material.

In FIG. 9, the memory structure 100 is electrically coupled to the upper interconnect 131 as well as to the lower interconnect 31 through the conductive via 61. Further, the upper interconnects 132, capacitor dielectric layer 110 and 120, conductive vias 62, and lower interconnects 32 form a capacitor 200.

Figure 10:
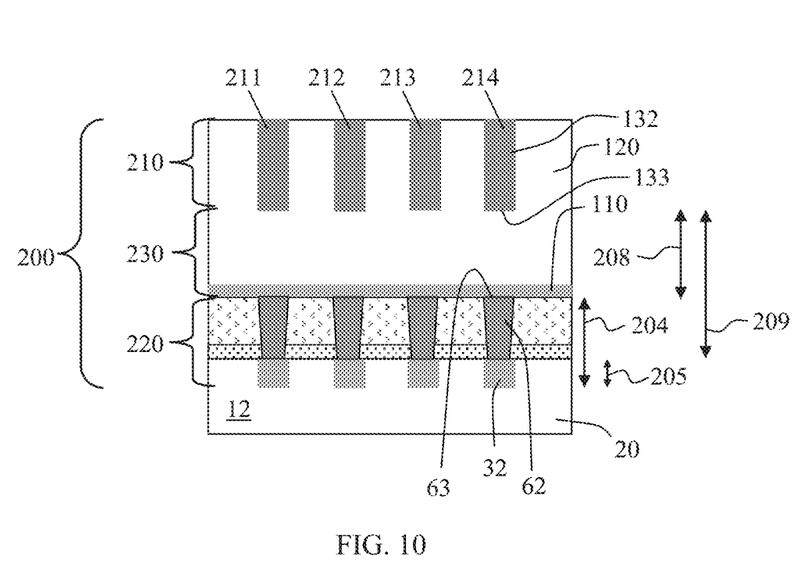
FIG. 10 is a cross sectional schematic view of the logic region of the integrated circuit of FIG. 9.

FIG. 10 illustrates the features of the logic region 12 of the integrated circuit 10 of FIG. 9. As shown in FIG. 10, the upper interconnects 132 form upper electrode elements 210 of the capacitor 200, the coupled conductive vias 62 and lower interconnects 32 form lower electrode elements 220 of the capacitor 200, and the portions of the layers 110 and 120 between the lowest surface 133 of the upper interconnects 132 and the uppermost surface 63 of the conductive vias 62 form the capacitor dielectric layer 230. As shown, the capacitor dielectric layer 230 has a thickness indicated by reference number 208 between the upper electrode element 210 (surface 133) and the lower electrode element 220 (surface 63).

In conventional processing, the capacitor's lower electrode element is formed by only the lower interconnect, i.e., with no coupled conductive via. Therefore, each lower electrode element 220 is formed with an increased height "a" indicated by reference number 204 and greater than the height 205 of conventionally formed lower electrode elements. Further, in the embodiment described, the conductive vias 62 are formed with a height over the lower interconnects 32 such that the uppermost surface of the lower electrode element (surface 63) is separated from the upper electrode element 210 (surface 133) by distance 208, while conventionally formed lower electrode elements are distanced from upper electrode elements by distance 209.

It is further noted that the uppermost surface of the lower electrode element (surface 63) is located at a height over the substrate 20 equal to the height 104 of the memory structure 100 over the substrate, as shown in FIG. 6.

Figure 11:
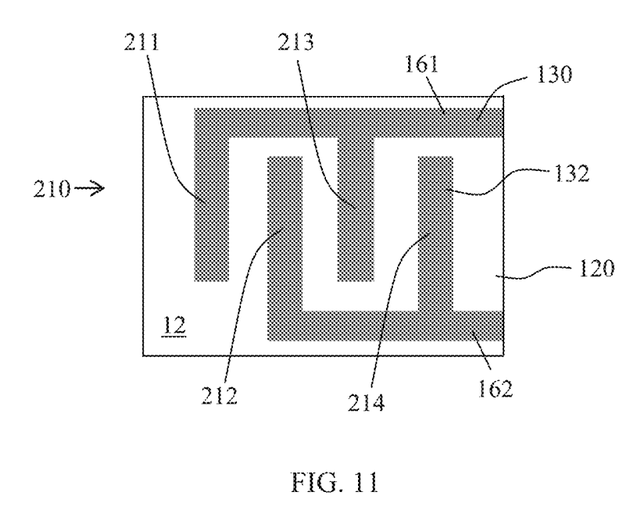
FIG. 11 is a layout of the logic region of the integrated circuit of FIG. 10.

FIG. 11 provides a plan schematic view of the upper electrode elements 210 in the logic region 12 of FIG. 10. Cross-referencing FIGS. 10 and 11, it may be seen that adjacent upper electrode elements 210 may be interconnected to different circuits 161 and 162 formed from the conductive layer 130. As shown, the upper electrode elements 210 are individually numbered 211, 212, 213, and 214. Upper electrode elements 211 and 213 are coupled to circuit 161 while upper electrode elements 212 and 214 are coupled to circuit 162. Further, this alternating pattern may continue in both the lateral dimension illustrated with the upper electrode elements of FIG. 10 and in the vertical dimension, i.e., the lower electrode element 220 directly below upper electrode element 211 is not coupled to the same circuitry as the upper electrode element 211, i.e., to circuitry 161. Likewise, the lower electrode elements 220, as well as underlying electrode elements that are not illustrated, alternatingly coupling to circuitry laterally and vertically. In this manner, the electrode elements may form the capacitor 200 as an interdigitated capacitor structure. It is noted that the alternating pattern is not limited to the lateral and vertical dimensions. It is contemplated that the number of electrode elements in each dimension of the array will vary depending on design requirements and the desired degree of capacitance.

As a result of the processing described in FIGS. 1-10, the integrated circuit 10 is formed with an integrated memory structure 100 and capacitor 200. Further, an electrode element of the capacitor 200 includes a conductive via coupled to an underlying lower interconnect. As formation of conductive vias is already included in the process flow for forming the memory structure, the capacitor may be formed with an improved capacitive structure without adding any process steps.

The methods described herein provide for the integration of logic and memory structures seamlessly. Also, while often described in the context of MRAM, the method employed herein may be used in RRAM technology. Further, the processes described herein are similar to processes in conventional CMOS processing such that necessary process equipment and actions are available.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration as claimed in any way. Rather, the foregoing detailed description will provide those skilled in the art with a convenient road map for implementing the exemplary embodiment or exemplary embodiments. It should be understood that various changes can be made in the function and arrangement of elements without departing from the scope herein as set forth in the appended claims and the legal equivalents thereof

What is claimed is:

1. A method for fabricating an integrated circuit including a memory device and a capacitor, the method comprising:
    forming, from a lower conductive layer, a lower memory interconnect and lower capacitor interconnects over a substrate;
    forming a conductive memory via coupled to the lower memory interconnect and conductive capacitor vias coupled to the lower capacitor interconnects;
    forming a memory structure over the memory via;
    forming a capacitor dielectric layer over the memory structure and over the capacitor vias; and
    forming, from an upper conductive layer, an upper memory interconnect coupled to the memory structure and upper capacitor interconnects over the capacitor dielectric layer overlaying the capacitor vias, wherein the lower capacitor interconnects, capacitor vias, capacitor dielectric layer, and upper capacitor interconnects form the capacitor.

2. The method of claim 1 further comprising forming an encapsulating layer over the memory structure and over the lower capacitor interconnects before forming the capacitor dielectric layer over the memory structure and over the capacitor vias.

3. The method of claim 1 further comprising forming an insulation layer over the substrate before forming the memory via coupled to the lower memory interconnect and the capacitor vias coupled to the lower capacitor interconnect, wherein forming the memory via coupled to the lower memory interconnect and the capacitor vias coupled to the lower capacitor interconnects comprises:
    etching the insulating layer to form via openings over the lower memory interconnect and the lower capacitor interconnect; and
    depositing tantalum nitride (TaN) or tungsten (W) in the via openings.

4. The method of claim 3 further comprising forming a barrier layer over the lower memory interconnect and over the lower capacitor interconnects before forming the insulating layer over the substrate.

5. The method of claim 1 wherein forming the memory structure over the memory via comprises:
    depositing magnetic tunnel junction (MTJ) layers over the memory via and over the capacitor vias; and
    etching the MTJ layers to form a stack of MTJ layers over the memory via, wherein the MTJ layers are removed from over the capacitor vias.

6. The method of claim 1 wherein forming, from the upper conductive layer, the upper memory interconnect coupled to the memory structure and the upper capacitor interconnects over the capacitor dielectric layer overlying the capacitor vias comprises:
    etching the capacitor dielectric layer to form an opening over the memory structure and trenches over the capacitor via, wherein the opening lands on the memory structure, and wherein a portion of the capacitor dielectric layer remains located between the capacitor vias and the trenches after etching the capacitor dielectric layer and,
    depositing the upper conductive layer over the substrate, in the opening, and in the trenches.

7. The method of claim 6 wherein depositing the upper conductive layer over the substrate, in the opening, and in the trenches comprises depositing copper over the substrate, in the opening, and in the trenches.

8. The method of claim 1 wherein:
    forming, from the lower conductive layer, the lower memory interconnect and the lower capacitor interconnects over the substrate comprises depositing a lower metallization layer over the substrate; and
    forming, from the upper conductive layer, the upper memory interconnect coupled to the memory structure and the upper capacitor interconnects over the capacitor dielectric layer overlaying the capacitor vias comprised depositing an upper metallization layer over the substrate, wherein no metallization layer is located between the lower metallization layer and the upper metallization layer.

9. A method for fabricating an integrated circuit including a memory device and a capacitor, the method comprising:
    providing a semiconductor substrate, wherein the semiconductor substrate includes a memory region and a logic region;
    forming a magnetic tunnel junction (MTJ) structure over the substrate in the memory region, wherein the MTJ structure includes a lowest surface formed by a bottom electrode and an uppermost surface formed by a top electrode, and wherein the MTJ structure has a height from the lowest surface to the uppermost surface;
    depositing a bottom electrode layer over the memory region and the logic region;
    depositing MTJ layers over the bottom electrode layer;
    depositing a top electrode layer over the MTJ layers; and
    etching the top electrode layer, the MTJ layers, and the bottom electrode layer to form the MTJ structure over the substrate in the memory region and to remove the top electrode layer, MTJ layers, and bottom electrode layer from the logic region; and
    forming a capacitor over the substrate in the memory region, wherein the capacitor includes a lower capacitor electrode element and an upper capacitor electrode element, and wherein the upper capacitor electrode element is separated from the lower capacitor electrode element by a distance equal to the height of the MTJ structure.

10. The method of claim 9 further comprising forming, from a lower conductive layer, a lower memory interconnect in the memory region and lower capacitor interconnects in the logic region before depositing the bottom electrode layer over the memory region and the logic region.

11. The method of claim 10 further comprises forming a conductive memory via coupled to the lower memory interconnect and conductive capacitor vias coupled to the lower capacitor interconnects before depositing the bottom electrode layer over the memory region and the logic region.

12. The method of claim 11 wherein forming the conductive memory via coupled to the lower memory interconnect and the conductive capacitor vias coupled to the lower capacitor interconnects comprises depositing tantalum nitride (TaN) or tungsten (W).

13. The method of claim 11 wherein depositing the bottom electrode layer over the memory region and the logic region comprises depositing the bottom electrode layer directly on the conductive memory via.

14. The method of claim 11 wherein the conductive capacitor vias and the lower capacitor interconnects form the lower capacitor electrode elements.

15. The method of claim 11 further comprises forming dielectric material over the conductive memory via and over the conductive capacitor vias.

16. The method of claim 15 wherein the thickness of the dielectric material over the conductive capacitor vias is equal to the distance.

17. The method of claim 15 further comprises forming, from an upper conductive layer, an upper memory interconnect coupled to the uppermost surface of the top electrode of the MTJ structure in the memory region and the upper capacitor interconnects over the dielectric material in the logic region.

18. The method of claim 17 wherein the upper capacitor interconnects form the upper capacitor electrode elements.

19. An integrated circuit comprising:
  a semiconductor substrate including a memory region and a logic region;
  a magnetic tunnel junction (MTJ) structure over the substrate in the memory region, wherein the MTJ structure includes a lowest surface formed by a bottom electrode layer at a first height over the substrate in the memory region, MTJ layers over the bottom electrode layer, and a top electrode layer over the MTJ layers; and
  a capacitor over the substrate in memory region, wherein the capacitor includes a lower capacitor electrode element having an uppermost surface at a second height over the substrate, wherein the second height is equal to the first height.

* * * * *